(12) United States Patent
Lu (10) Patent No.: US 10,524,385 B1
(45) Date of Patent: Dec. 31, 2019

(54) FAN MODULE AND ELECTRONIC DEVICE WITH THE SAME

(71) Applicant: NANNING FUGUI PRECISION INDUSTRIAL CO., LTD., Nanning (CN)

(72) Inventor: Yi-Te Lu, New Taipei (TW)

(73) Assignee: NANNING FUGUI PRECISION INDUSTRIAL CO., LTD., Nanning (CN)

( * ) Notice: Subject to any disclaimer, the term of this patent is extended or adjusted under 35 U.S.C. 154(b) by 28 days.

(21) Appl. No.: 16/022,964

(22) Filed: Jun. 29, 2018

(51) Int. Cl.
*H05K 7/20* (2006.01)
*H05K 7/14* (2006.01)

(52) U.S. Cl.
CPC ....... *H05K 7/20172* (2013.01); *H05K 7/1401* (2013.01); *H05K 7/1489* (2013.01); *H05K 7/20772* (2013.01)

(58) Field of Classification Search
CPC ............. H05K 7/20172; H05K 7/1489; H05K 7/1401; H05K 7/20772; F04D 25/0613; F04D 25/08; F04D 25/12; F04D 29/601; F04D 29/602–603; F04D 29/646
USPC .................................................. 361/807, 810
See application file for complete search history.

(56) References Cited

U.S. PATENT DOCUMENTS

| | | | | |
|---|---|---|---|---|
| 7,048,498 B2 * | 5/2006 | Kosugi | ................. | F04D 29/601 415/118 |
| 7,068,505 B2 * | 6/2006 | Kosugi | ................. | F04D 29/601 165/104.33 |
| 7,661,923 B2 * | 2/2010 | Kosugi | ................. | F04D 29/601 206/470 |
| 8,830,673 B2 * | 9/2014 | Kuo | .................... | H05K 7/20172 312/236 |
| 8,913,382 B2 * | 12/2014 | Wang | ................... | H05K 7/1492 361/679.5 |
| 2005/0105271 A1 * | 5/2005 | Lu | ....................... | H05K 7/20172 361/695 |
| 2007/0247806 A1 * | 10/2007 | Pan | ....................... | F04D 29/582 361/679.48 |
| 2012/0148397 A1 * | 6/2012 | Tsai | ....................... | F03D 80/00 415/213.1 |
| 2013/0100613 A1 * | 4/2013 | Nakai | ................ | H05K 7/20563 361/695 |
| 2014/0160716 A1 * | 6/2014 | He | .......................... | H05K 7/14 361/810 |

(Continued)

FOREIGN PATENT DOCUMENTS

CN      201867722 U      6/2011

*Primary Examiner* — Robert J Hoffberg
(74) *Attorney, Agent, or Firm* — ScienBiziP, P.C.

(57) ABSTRACT

A fan module used on an electronic device, the electronic device includes a main board and a connector. The fan module includes a tray, a fan mounted on the tray, a supporting frame mounted on the fan, and a printed circuit board mounted on the fan by the supporting frame, the printed circuit board includes a main body and a conducting strip. The main board is perpendicular to the printed circuit board, and the connector is electrically connected to the conducting strip. The assembly of the printed circuit board and the main board is perpendicular to each other, and the supporting frame is compact to have the printed circuit board mounted on the fan, which is greatly reducing the size of the fan module in a depth direction with space saved and low cost.

9 Claims, 11 Drawing Sheets

(56) References Cited

U.S. PATENT DOCUMENTS

2016/0353591 A1* 12/2016 Chen ................... F04D 19/002
2018/0298920 A1* 10/2018 Hino ................... F04D 29/5813

* cited by examiner

FAN MODULE AND ELECTRONIC DEVICE WITH THE SAME

FIELD

The subject matter herein generally relates to a fan module, and more particularly to electronic device having a fan module.

BACKGROUND

Electronic devices such as mainframes, servers, and so on need a fan for heat dissipation. For the traditional fan module, a printed circuit board of the fan is electrically connected to a main board or a connector of the electronic device. Actually, the printed circuit board and the main board are disposed in a same direction, that is to say, the circuit board is parallel to the main board, and an overall space of the fan is increased in a depth direction. When the fan is assembled to the electronic devices, an overall space of the electronic devices needs to be increased, increasing device size and costs.

Thus, there is room for improvement within the art.

BRIEF DESCRIPTION OF THE DRAWINGS

Many aspects of the present disclosure are better understood with reference to the following drawings. The components in the drawings are not necessarily drawn to scale, the emphasis instead being placed upon clearly illustrating the principles of the present disclosure. It will be appreciated that for simplicity and clarity of illustration, where appropriate, reference numerals have been repeated among the different figures to indicate corresponding or analogous elements.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The disclosure is illustrated by way of example and not by way of limitation in the figures of the accompanying drawings in which like reference numerals indicate the same or similar elements. It should be noted that references to "an" or "one" embodiment in this disclosure are not necessarily to the same embodiment, and such references can mean "at least one".

Figure 1:
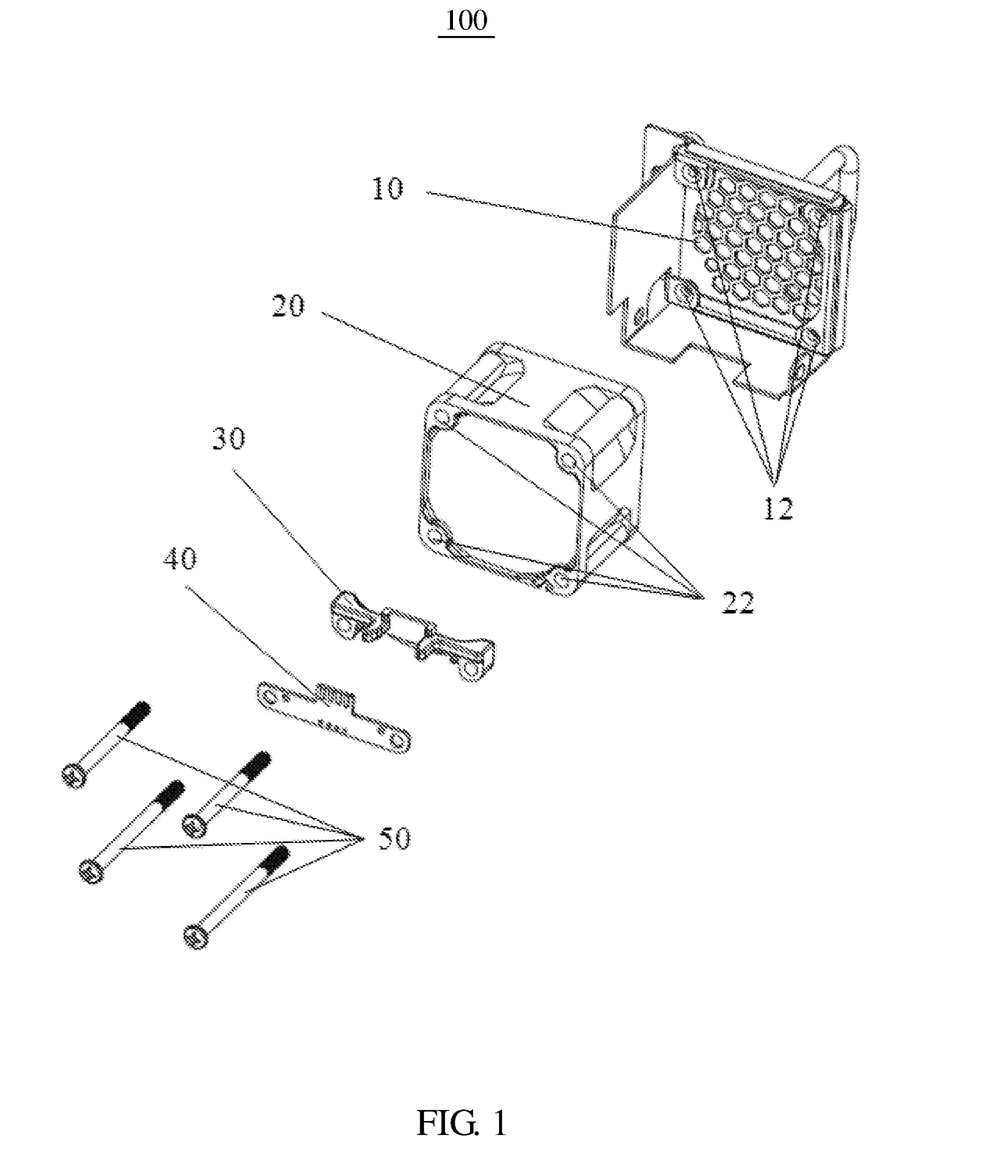
FIG. 1 is an exploded view of an embodiment of a fan module.

Referring to FIG. 1, an embodiment of a fan module 100 includes a tray 10, a fan 20, a supporting frame 30, a printed circuit board 40 and a fastener 50. The tray 10, the fan 20, the supporting frame 30 and the printed circuit board 40 are mounted together by the fastener 50. The fan 20 is received by the tray 10. In an embodiment, the tray 10 defines a first connecting hole 12, the fan 20 defines a second connecting hole 22 relative to the first connecting hole 12, the fastener 50 passes through the first connecting hole 12 and the second connecting hole 22 to mount the tray 10 and the fan 20. In another embodiment, the tray 10 and the fan 20 may adopt other mounting methods, such as a buckle, a clamp, and so on.

Figure 2:
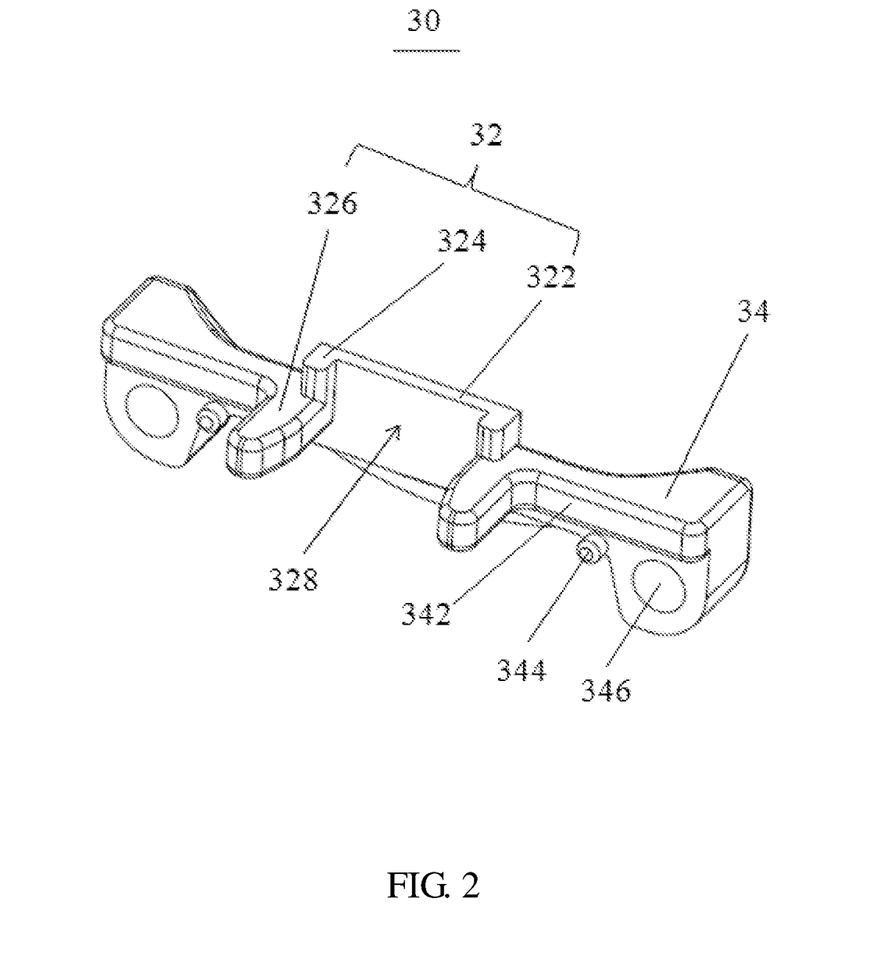
FIG. 2 is an isometric view of a supporting frame in a first angle of view in FIG. 1.
Figure 3:
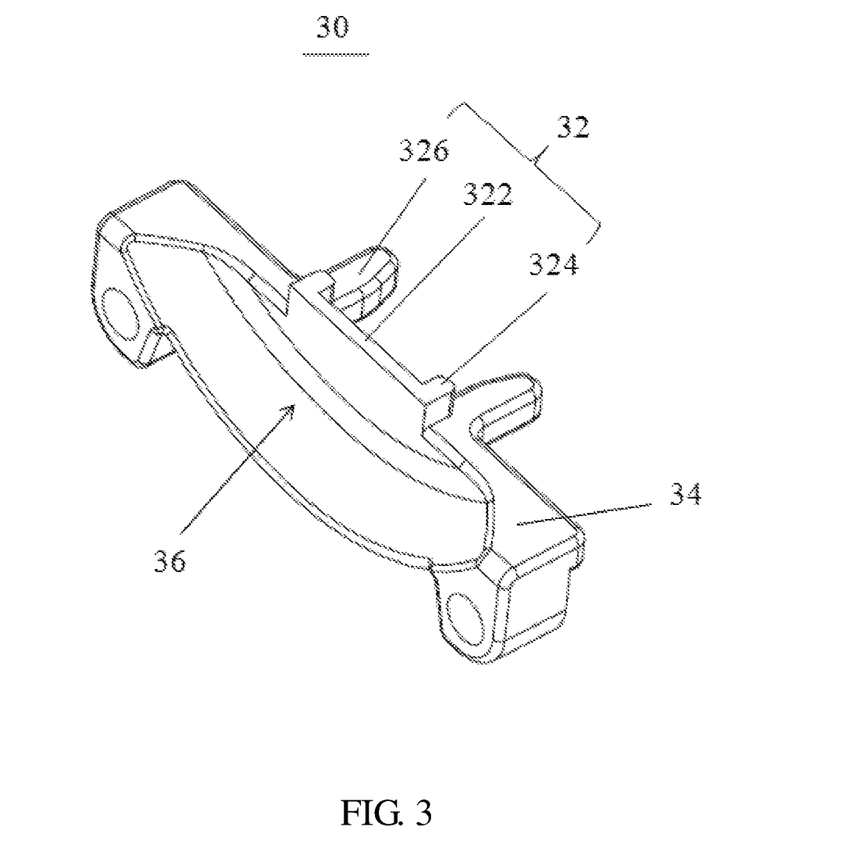
FIG. 3 is an isometric view of the supporting frame in a second angle of view in FIG. 1.

In FIGS. 2 and 3, the supporting frame 30 includes a supporting portion 32 and a connecting lug 34, the supporting portion 32 and the connecting lug 34 form a receiving space. The connecting lug 34 extends from both sides of the supporting portion 32. The supporting portion 32 includes a plate 322, a block 324 extending vertically from both side of the plate 322, and a guiding bar extending vertically from both side of the plate 322. The block 324 is connected to the guiding bar 326, and the block 324 is located above the guiding bar 326. The guiding bar 326 is longer than the block 324. The plate 322 and the block 324 together forms a receiving groove 328. The connecting lug 34 has a rib 342, a protruding post 344 and a third connecting hole 346. The rib 342 and the guiding bar 326 are on the same plane.

Figure 4:
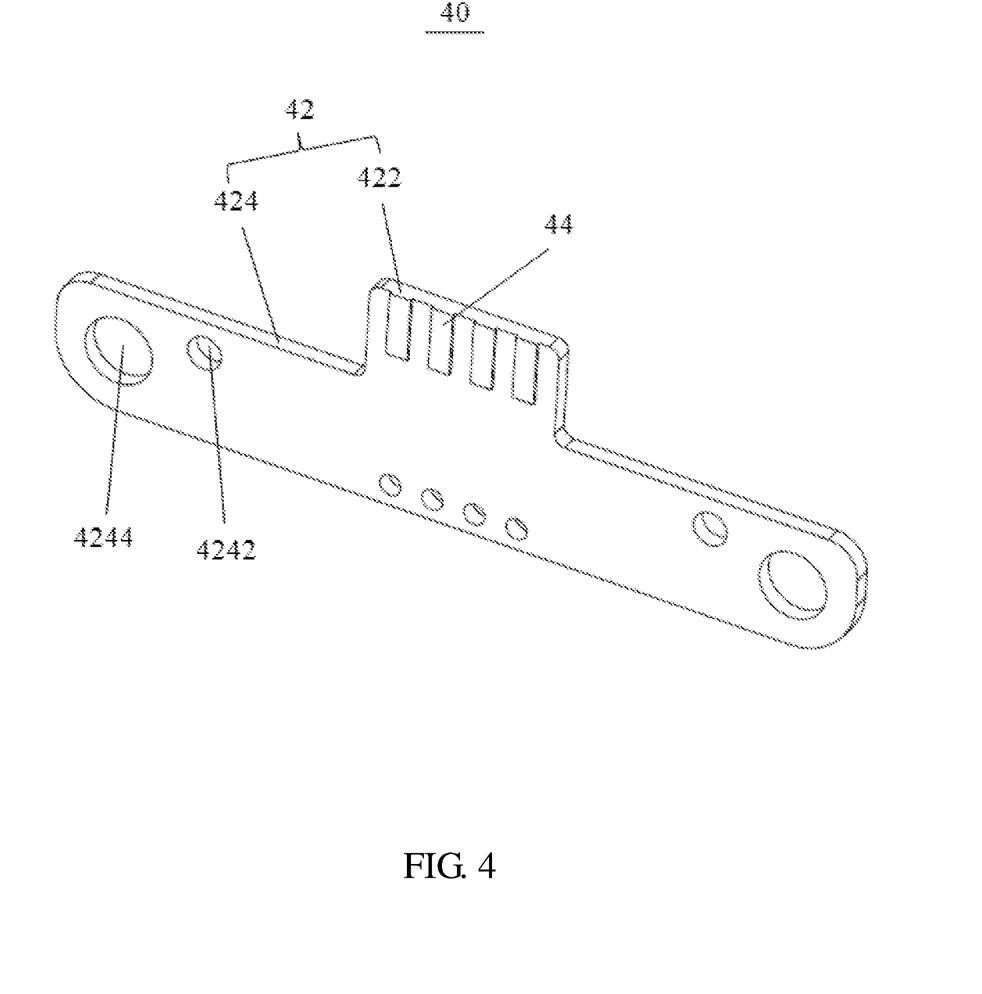
FIG. 4 is an isometric view of a printed circuit board in FIG. 1.
Figure 5:
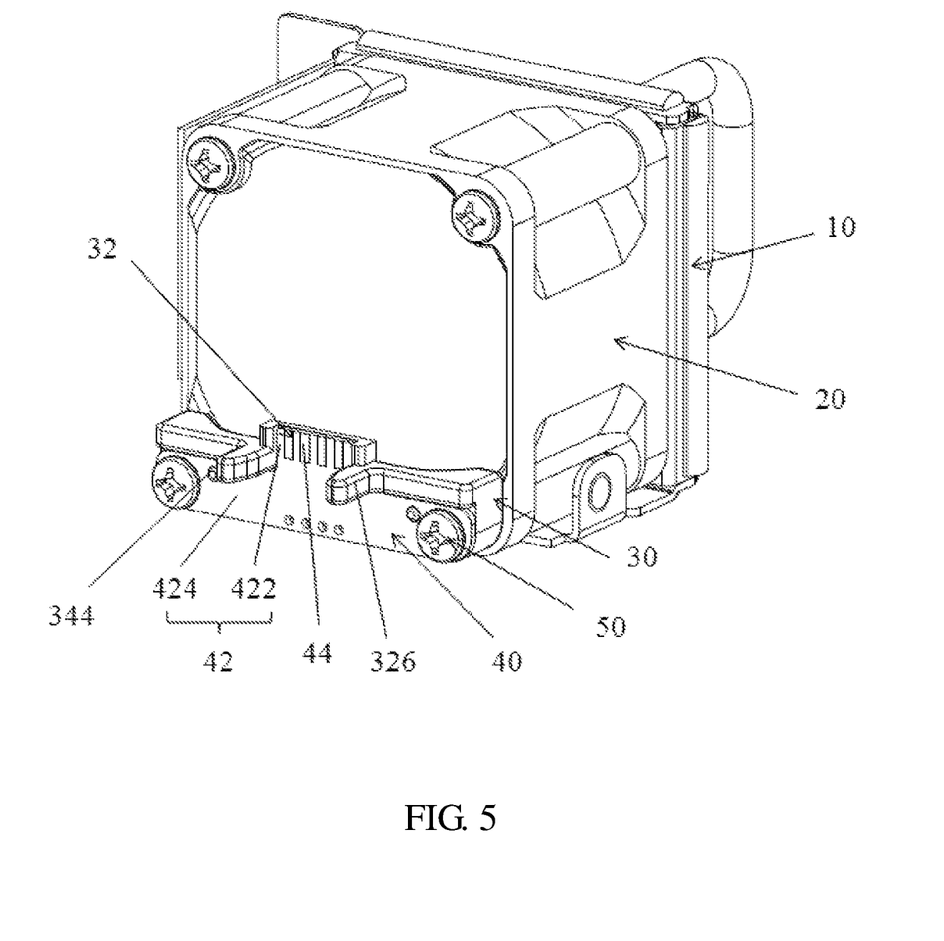
FIG. 5 is an isometric view of the fan module in FIG. 1.

In FIG. 4, the printed circuit board 40 includes a main body 42 and a conducting strip 44. The main body 42 includes a connecting portion 422 and a mounting portion 424. The mounting portion 424 defines a positioning hole 4242 and a fourth connecting hole 4244, and the conducting strip 44 is on the connecting portion 424.

In FIGS. 1 to 5, when the fan module 100 assembled, the fan 20 is placed and received in the tray 10. The first connecting hole 12 of the tray 10 corresponds to the second connecting hole 22 of the fan 20. The supporting frame 30 is close to the fan 20, the receiving space 36 of the supporting frame contacts with fan 20, and the second connecting hole 22 corresponds to the third connecting hole 346 of the supporting frame 30, the main body 42 of the printed circuit board is positioned on the supporting frame 30.

In detail, the protruding post 344 of the supporting frame 30 passes through the positioning hole 4242 of the printed circuit board 40. The main body 42 is guided by the guiding bar 326, the mounting portion 424 is positioned on the connecting lug 34 through the rib 342. The connecting portion 422 enters into the receiving groove 328 of the supporting frame 30, and the third connecting hole 346 of the supporting frame 30 corresponds to the fourth connecting hole 4244 of the printed circuit board 40, and then the fan module 100 is mounted by the fastener 50. A width of the connecting portion 422 is equal to a width of the receiving groove 328 to locate the connecting portion 422. The mounting portion 424 is located below the guiding bar 326 and the rib 342 to locate the mounting portion 424.

Figure 6:
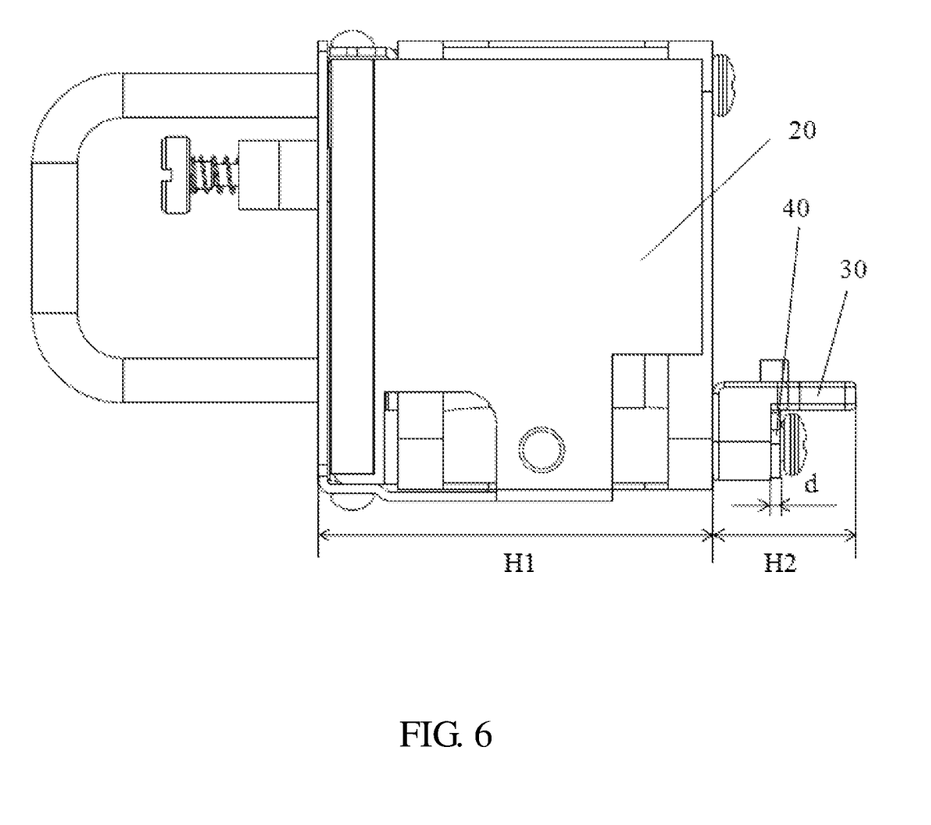
FIG. 6 is an side isometric view of the fan module in FIG. 1.

In FIG. 6, when the fan module 100 is assembled on the electronic device, the fan module has a length H1+H2 in a depth direction. The printed circuit board 40 is assembled on the fan module in a thickness d direction. Because of the small thickness d, the supporting frame 30 used to support the printed circuit board has the small size H2 in the depth direction, and greatly reduces the overall size of the fan module length H1+H2.

Figure 7:
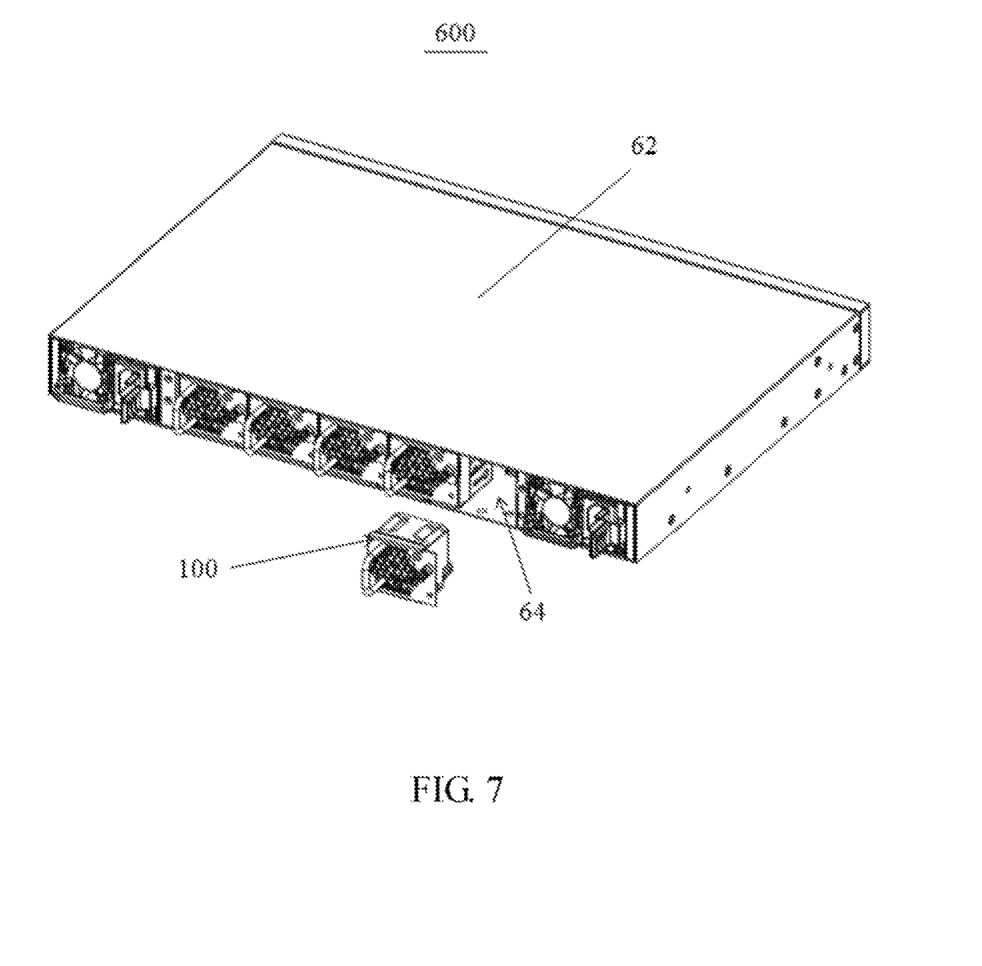
FIG. 7 is an isometric view of an embodiment of electronic device with the fan module in FIG. 1.
Figure 8:
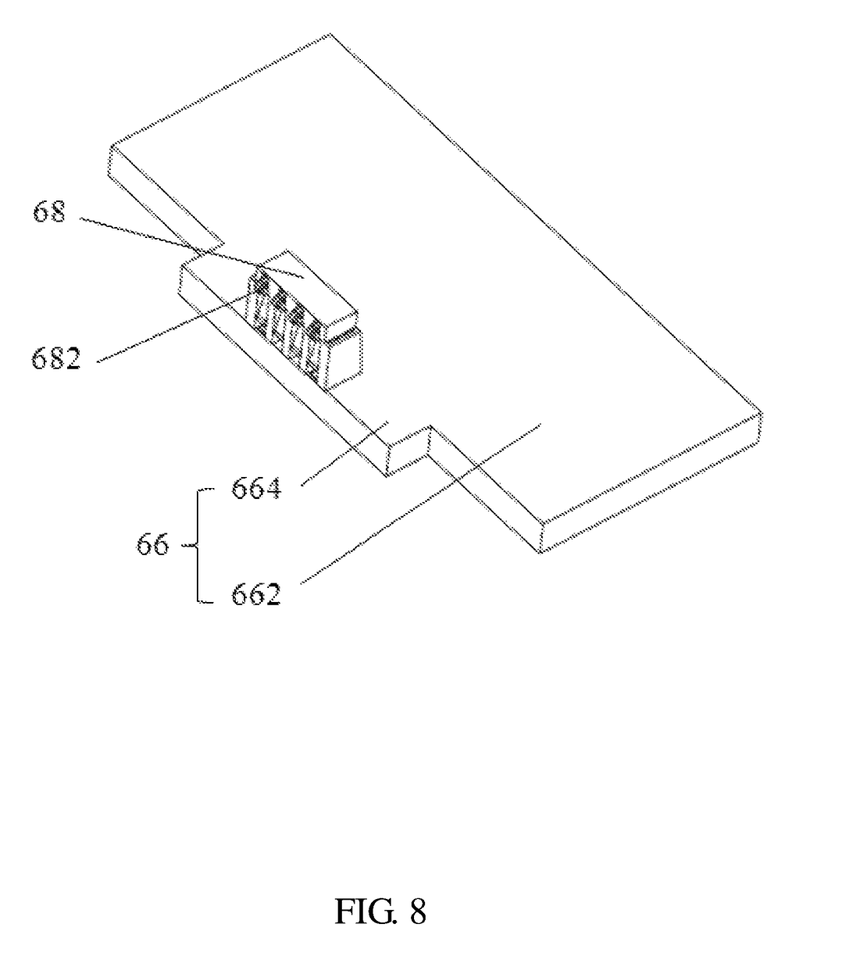
FIG. 8 is an isometric view of a main board assembled with a connector of the electronic device shown in FIG. 7.

In FIGS. 7 and 8, the electronic device 600 includes a shell 62 and a fan module 100. On one side, the shell 62 has a plurality of openings 64 for a fan module 100 to be inserted into. Inside shell 62 is a main board 66, a connector 68 and other electronic components (not shown). The main board 66 includes a base board 662 and a extension 664. The connector 68 is disposed on an edge of the extension 664. The connector 68 has a elastic strip 682 for electrical connection to the printed circuit board 40 of the fan module 100. The electronic device 600 may be a server, a memory, and so on, which needs heat dissipation.

Figure 9:
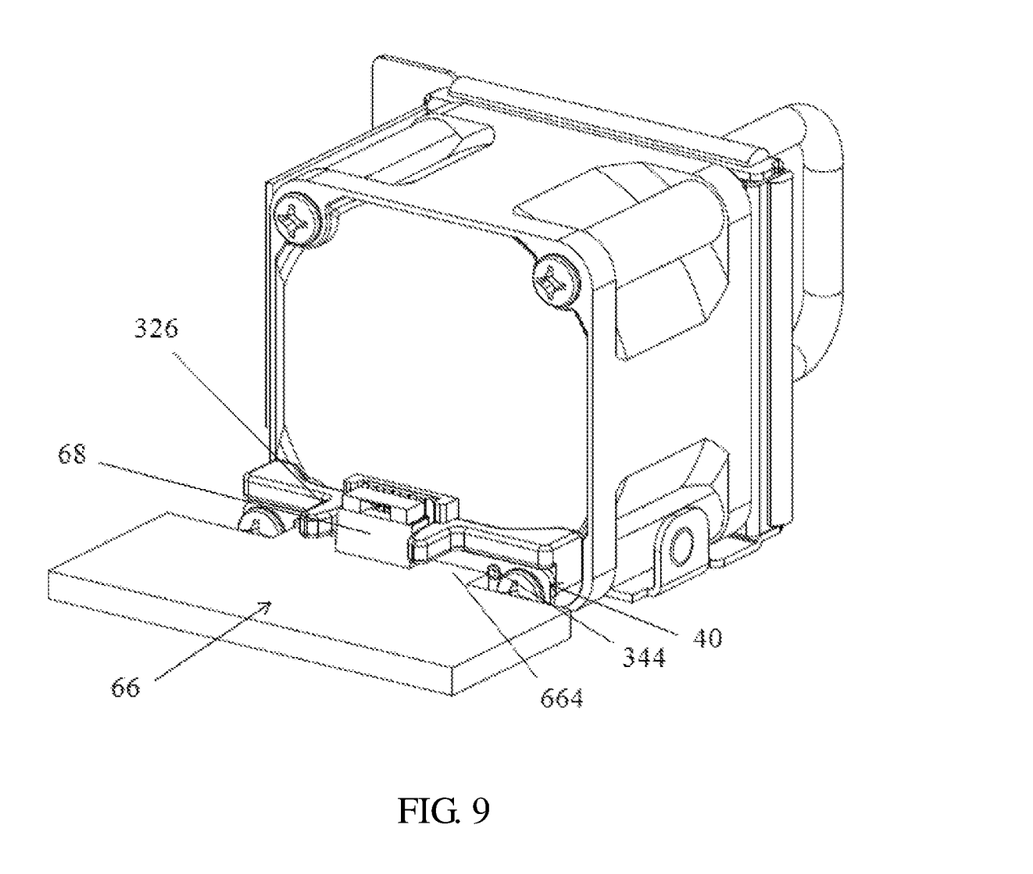
FIG. 9 is an isometric view of the fan module assembled with the connector in FIG. 7.

In FIG. 9, when the fan module 100 is assembled with the electronic device 600, the connector 68 is guided and limited by the guiding bar 326. The extension 664 located between two of the protruding post 344, and the connector 68 corresponds to the conducting strip 44 of the printed circuit board 40. The main board 66 is in a plane is perpendicular to a plane of the printed circuit board 40.

Figure 10:
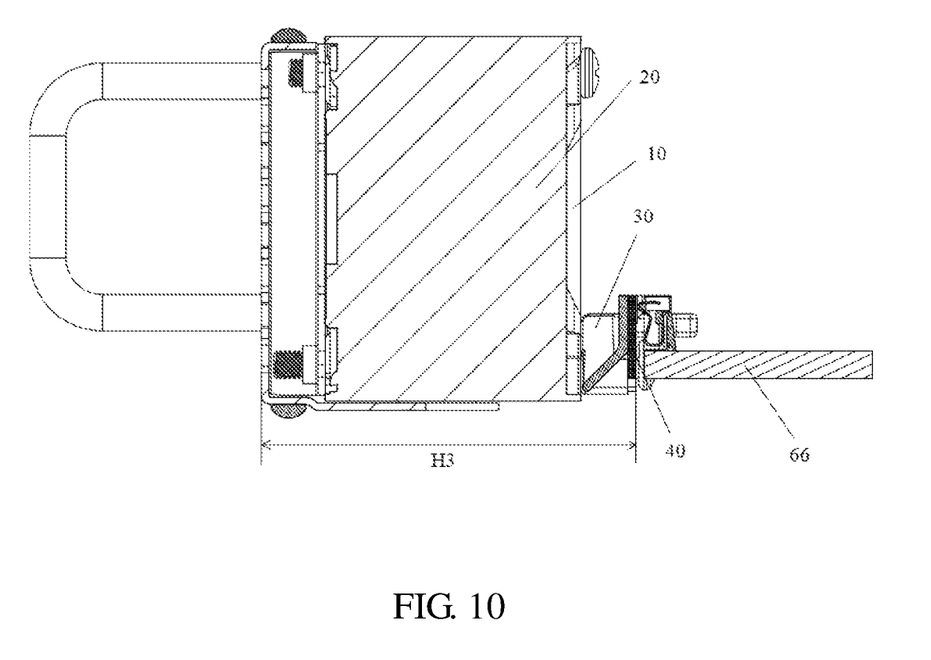
FIG. 10 is a cross-sectional view of the fan module assembled with the connector in FIG. 7.
Figure 11:
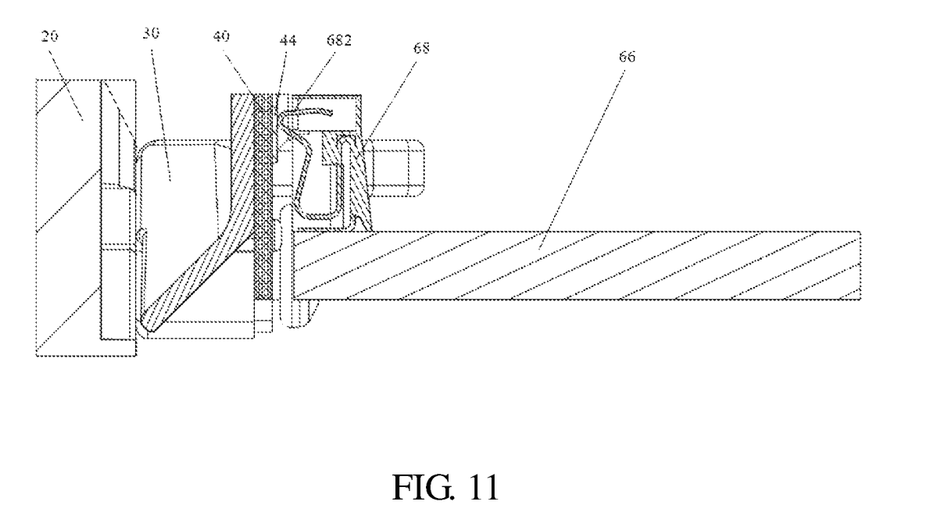
FIG. 11 is a partial cross-sectional view of the fan module assembled with the connector in FIG. 7.

In FIGS. 10 and 11, when the fan module 10 is assembled to the main board 66 of the electronic device 600, the conducting strip 44 of the printed circuit board 40 is electrically connected to the elastic strip 682 of the connector 68. The length H3 of the assembly is smaller than the overall size of the fan module length H1+H2. An internal space of the electronic device 600 is saved.

The fan module and electronic device with the same, the printed circuit board 40 is assembled in a thickness direction. Because of small thickness of the printed circuit board, the main board in a plane is perpendicular to a plane of the printed circuit board, and the supporting frame is compact to have the printed circuit board mounted on the fan, which is greatly reducing the size of the fan module in a depth direction with space saved and low cost.

The embodiments shown and described above are only examples. Many details are often found in the art such as the features of a fan module and electronic device with the same. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A fan module used on an electronic device comprising a main board and a connector, the fan module comprising:
   a fan;
   a supporting frame mounted on the fan; and
   a printed circuit board mounted on the fan by the supporting frame, the printed circuit board comprising a main body and a conducting strip; wherein the main board is perpendicular to the printed circuit board, and the connector is electrically connected to the conducting strip, the supporting frame comprises a supporting portion and two connecting lugs, the two connecting lugs extend from both sides of the supporting portion, and a portion of the fan is in contact with a receiving space defined by the supporting portion and the two connecting lugs.

2. The fan module of claim 1, further comprising a tray and a fastener, wherein the fan is mounted on the tray, the tray defines a first connecting hole, the fan defines a second connecting hole, the supporting frame defines a third connecting hole, and the printed circuit board defines a fourth connecting hole, the fastener successively passes through the first connecting hole, the second connecting hole, and the third connecting hole and the fourth connecting hole to mount the tray, the fan, the supporting frame and the printed circuit board together.

3. The fan module of claim 1, wherein the supporting portion comprises a plate, a block extends vertically from both sides of the plate, and a guiding bar extends vertically from both sides of the plate, the block is connected to the guiding bar, and the guiding bar is longer than the block, the plate and the block together forms a receiving groove, each of the connecting lugs has a rib and a protruding post, and the rib and the guiding bar are on a same plane.

4. The fan module of claim 3, wherein the main body comprises a connecting portion and a mounting portion, the mounting portion defines a positioning hole, and the conducting strip is on the connecting portion.

5. The fan module of claim 4, wherein the mounting portion is positioned on the two connecting lugs through the rib, the protruding post passes through the positioning hole, and the connecting portion is received by the receiving groove.

6. The fan module of claim 3, wherein the main board comprises a base board and an extension, and the connector is positioned on the extension.

7. The fan module of claim 6, wherein the extension is limited by the protruding post, the connector is limited by the guiding bar, and the connector is electrically connected to the conducting strip.

8. The fan module of claim 1, wherein a contacting surface of the conducting strip and the connector is perpendicular to the main board.

9. An electronic device, comprising:
   a main board, a connector and a fan module, the fan module comprising:
   a tray;
   a fan mounted on the tray;
   a supporting frame mounted on the fan; and
   a printed circuit board mounted on the fan by the supporting frame, the printed circuit board comprising a main body and a conducting strip; wherein the main board is perpendicular to the printed circuit board, and the connector is electrically connected to the conducting strip,
   the supporting frame comprises a supporting portion and two connecting lugs, the two connecting lugs extend from both sides of the supporting portion, and a portion of the fan is in contact with a receiving space defined by the supporting portion and the two connecting lugs.

* * * * *